(12) United States Patent
Brist et al.

(10) Patent No.: US 7,022,919 B2
(45) Date of Patent: Apr. 4, 2006

(54) PRINTED CIRCUIT BOARD TRACE ROUTING METHOD

(75) Inventors: Gary A. Brist, Yamhill, OR (US);
Gary B. Long, Aloha, OR (US);
William O. Alger, Portland, OR (US);
Dennis J. Miller, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 208 days.

(21) Appl. No.: 10/610,147

(22) Filed: Jun. 30, 2003

(65) Prior Publication Data

US 2004/0262036 A1 Dec. 30, 2004

(51) Int. Cl.
*H05K 1/16* (2006.01)

(52) U.S. Cl. ............... 174/260; 174/256; 174/261; 174/255; 716/15

(58) Field of Classification Search ............ 174/258, 174/260, 261, 250, 256; 361/760; 257/778; 428/209, 298.1

See application file for complete search history.

(56) References Cited

U.S. PATENT DOCUMENTS

| 4,103,102 | A | * | 7/1978 | Klein ................... 174/254 |
| 4,115,185 | A | * | 9/1978 | Carlson et al. .......... 430/318 |
| 5,837,624 | A | * | 11/1998 | Sakaguchi et al. ....... 442/208 |
| 6,556,583 | B1 | * | 4/2003 | Hayashi et al. .......... 370/463 |

* cited by examiner

*Primary Examiner*—K. Cuneo
*Assistant Examiner*—Ishwar (I. B.) Patel
(74) *Attorney, Agent, or Firm*—Carrie A. Boone, P.C.

(57) ABSTRACT

An I/O routing pattern method is disclosed, for use with heterogeneous printed circuit boards (PCBs), such as those embedded with a reinforcement material, for example, a fiberglass weave. Traces are routed on the PCB so as to reduce sensitivity to changes in the dielectric constant ($D_k$), which are brought about by the strands of reinforcement material contained within the PCB laminate. The method minimizes the local variations, such as the $D_k$, time of flight, and capacitance variations, that are observed with traditional routing methods on heterogeneous PCBs.

14 Claims, 5 Drawing Sheets

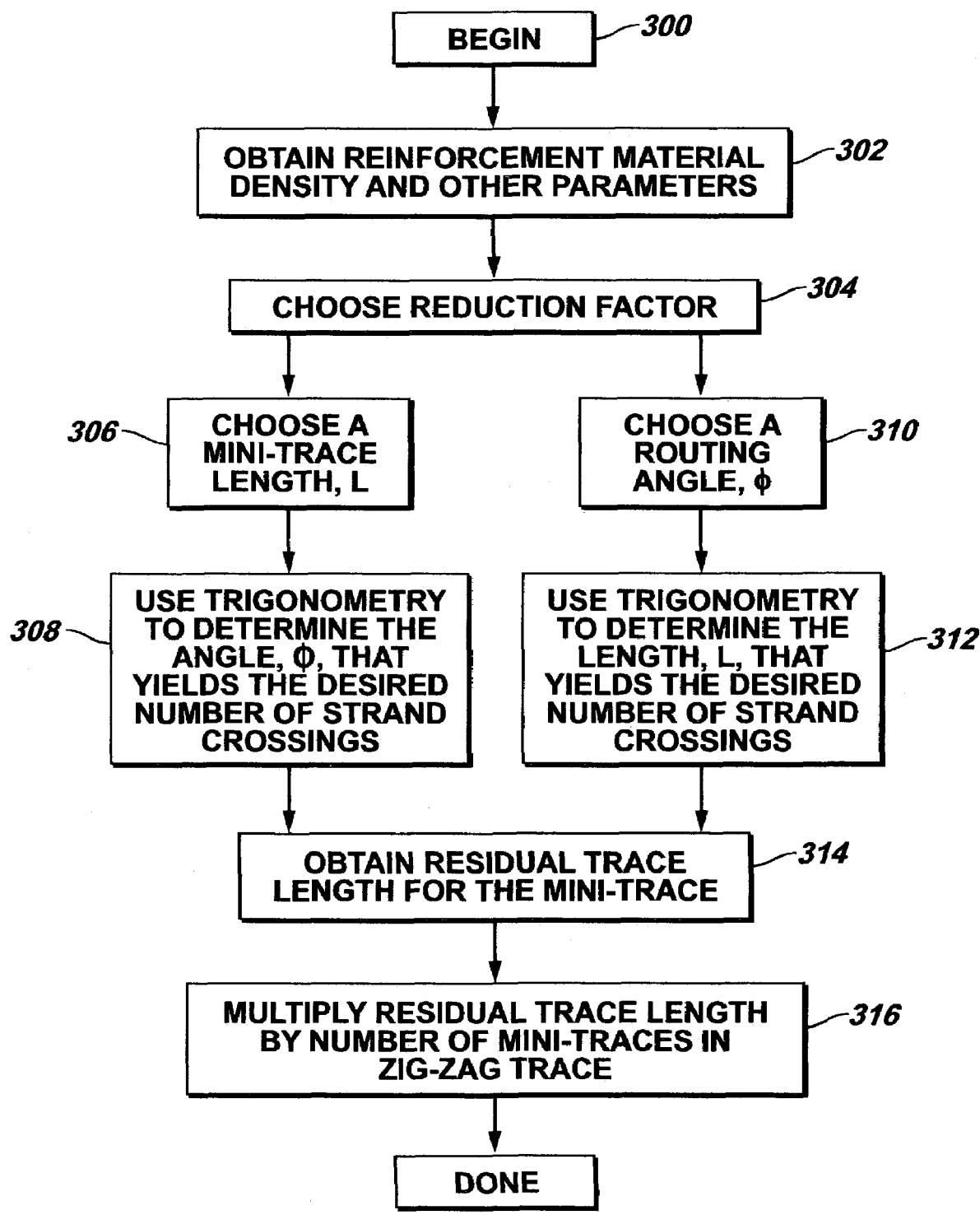

PRINTED CIRCUIT BOARD TRACE ROUTING METHOD

FIELD OF THE INVENTION

This invention relates to printed circuit boards and, more particularly, to techniques for routing traces on printed circuit boards.

BACKGROUND OF THE INVENTION

Printed circuit boards (PCBs), also known as printed wiring boards, are used to interconnect and assemble electronic circuits. The operating temperature, mechanical strength, and other characteristics of a PCB, may vary according to the application in which the PCB is used. PCBs provide electrical conductor paths between the circuits disposed upon them.

Some PCBs consist of paper or woven glass impregnated with an epoxy resin. PCBs may include materials such as copper, iron, aluminum, or ceramic. Flexible PCBs may have polyester or polyimide bases. Ultimately, PCBs typically include at least a resin-based material, a reinforcement material, and one or more conductive foils.

FR-4 is the most common printed circuit board material, and is used in the majority of computer-based applications. The reinforcement material in FR-4 is typically a woven fiberglass material that is impregnated with an epoxy resin, which may vary in composition.

One of the measured characteristics of the PCB is its dielectric constant. The dielectric constant of a material relates to the velocity at which signals travel within the material. The dielectric constant is actually variable, and may change with a modification in frequency, temperature, humidity, and other environmental conditions.

Traces etched or otherwise routed on the PCB carry signals between circuits at a certain speed. The propagation of the signal between the circuits, known as its "time of flight," is proportional to the length of the trace. Thus, board layout designers typically route straight-line traces between the circuits on the PCB.

The speed of a signal propagating along a trace is inversely proportional to the square root of the dielectric constant of the PCB upon which the trace is formed. Thus, the dielectric constant of the PCB affects the speed of all signals propagating on the PCB. Since most PCBs are not homogeneous, but a blend of materials, the dielectric constant measured on the PCB is slightly different when taken over a strand of woven glass, as compared to a measurement taken between two strands of glass.

The woven glass of the PCB is typically aligned at right angles within the PCB material, forming a familiar weave pattern. For those PCBs that are rectangular or square in shape, the weave pattern within the PCB is thus substantially orthogonal to two sides of the PCB and parallel to two sides, although deviations from this alignment may be found. Likewise, signal traces, such as input/output (I/O) buses, and other electrical interconnect traces, are typically routed in a direction parallel to the sides of the PCB, taking right angle turns where a change in direction is needed.

The routing practices, as well as the material properties of the PCB, result in a condition where traces may be disposed parallel to the glass strands or orthogonal to the glass strands. Those that run in parallel will have a random probability of being routed directly over a parallel glass strand or between a set of parallel glass strands. Even when a trace runs over a glass strand, their relative positions may change, due to a skewing of the underlying glass strands. Those traces that run orthogonal to the glass strands will intermittently be disposed over glass strands all along the trace. These varying conditions make it difficult to ascertain the dielectric constant of the PCB beneath the trace, thus making the signal propagation speed along the trace difficult to successfully predict.

When a trace is disposed over a parallel glass strand, the trace achieves a relatively higher dielectric constant, $D_k$, than when the trace is disposed between two glass strands. Thus, two traces that are parallel to one another and identical in length on the same printed circuit board may propagate signals at different speeds, based upon the relative position of the underlying material within the PCB. In addition to the speed difference, impedance variations between the traces are likely to occur. These phenomena are particularly troublesome for bus signals, in which multiple traces for each I/O line of the bus, while having identical lengths between circuits, do not have identical impedances and may not propagate at the same speeds. The variation in impedance and speed are dependent on the type and size of the glass weave, the size of the trace, and the orientation of the trace.

Thus, there is a need for a method to route traces such that the dielectric constant can be predicted and, thus, the speed and impedance of signals along the trace can be more accurately known.

BRIEF DESCRIPTION OF THE DRAWINGS

For a more complete understanding of this document, reference is made to the following descriptions taken in connection with the accompanying drawings in which:

FIG. 5 is a flow diagram for illustrating the trace routing method, according to some embodiments;

DETAILED DESCRIPTION

Figure 1:
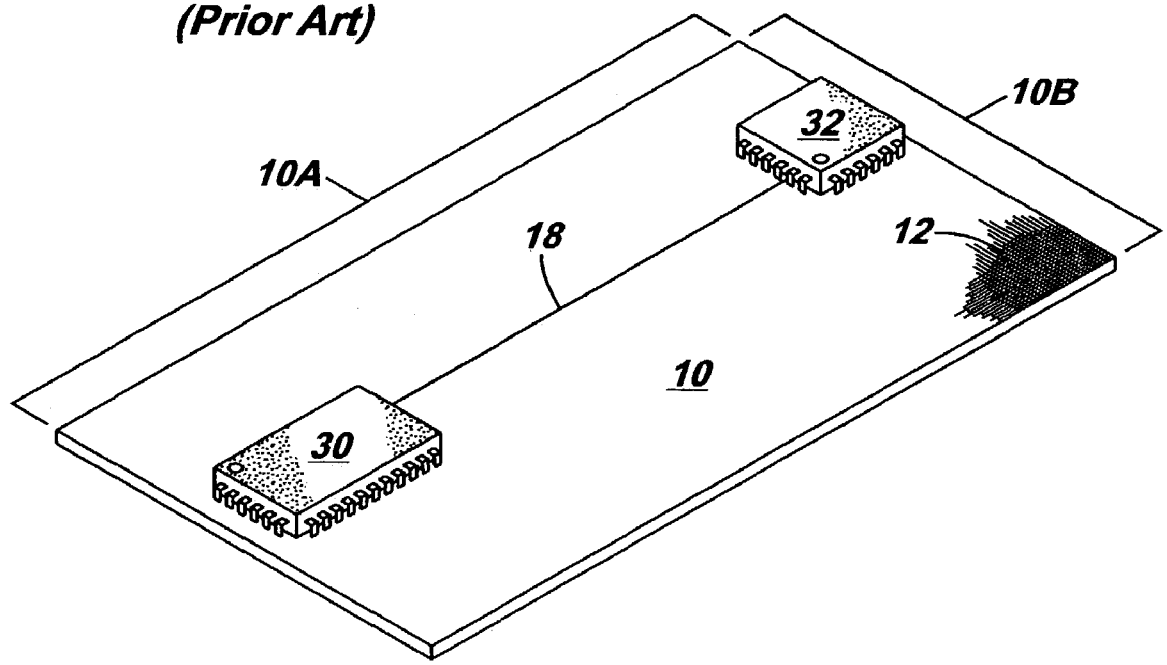
FIG. 1 is a perspective view of a printed circuit board including an inset depicting a reinforcement matrix, according to the prior art.

In accordance with some embodiments described herein, an I/O routing pattern method is disclosed, for use with heterogeneous printed circuit boards (PCBs), such as those embedded with a reinforcement material, for example, a fiberglass weave. Traces are routed on the PCB so as to reduce sensitivity to changes in the dielectric constant ($D_k$), which are brought about by the strands of reinforcement material contained within the PCB laminate. The method minimizes the impact of local variations, such as the $D_k$, time of flight, and capacitance variations, that are observed with traditional routing methods on heterogeneous PCBs.

In some embodiments, traces are routed between circuits on the PCB in a zig-zag pattern, such that multiple strands of reinforcement material are disposed beneath each portion of the zig-zag trace. The strands are embedded into the PCB in a known manner, such as with an FR-4-type PCB, in which glass strands are aligned at right angles to one another in a weave pattern. For a square or rectangular cut of the PCB, the weave pattern is orthogonal to two sides of the PCB and parallel to two sides. The zig-zag traces, including multiple mini-traces disposed at predetermined angles, cross over multiple strands of the reinforcement material. For multiple traces, such as differential signal traces and bus signal traces, the dielectric constant for each trace is substantially similar.

In some other embodiments, circuits are disposed on the PCB in a non-orthogonal configuration while traces are routed in straight lines and/or right angles between the circuits. Again, the strands of the reinforcement material are embedded within the PCB material in a weave pattern, which is orthogonal and parallel to the sides of the PCB. The straight-line and/or right-angle traces cross over multiple strands of the reinforcement material. For multiple traces which are disposed in parallel and equidistant from one another, the dielectric constant of each trace is substantially similar.

In still other embodiments, the strands of reinforcement material that form the weave pattern are impregnated into the resin-based material such that the weave pattern is not orthogonal to and parallel to the sides of the PCB. As another option, a sheet of PCB laminate, such as FR-4, is cut such that the sides of the cut PCB are not orthogonal or parallel to the weave pattern of the impregnated glass fibers. Using such a non-orthogonally cut PCB, circuits are disposed upon the PCB in a typical arrangement, that is, the circuits are laid orthogonal to one of the sides of the cut PCB. Likewise, straight-line and/or right-angle traces are routed between the circuits, such that the traces cross over multiple strands of reinforcement material. For differential signal traces and bus traces routed in this manner, the dielectric constant of each trace is substantially similar.

In the following detailed description, reference is made to the accompanying drawings, which show by way of illustration specific embodiments in which the invention may be practiced. For convenience, a printed circuit board reinforced with glass material is described in order to illustrate the properties of heterogeneous printed circuit boards. However, it is to be understood that other printed circuit board materials, now known or yet to be developed by those of ordinary skill in the art, may be used in practicing the principles of the invention. The following detailed description is, therefore, not to be construed in a limiting sense, as the scope of the present invention is defined by the claims.

In FIG. 1, a printed circuit board (PCB) 10 is depicted, according to the prior art. The PCB 10 includes a resin-based material (not shown), such as an epoxy resin, a reinforcement material 12, such as woven fiberglass strands, and a conductive foil (not shown), such as copper, for etching or otherwise routing a trace 18 between circuits 30 and 32 disposed on the PCB 10. The resin-based material has a different, typically lower, $D_k$, than the reinforcement material or glass strands 12.

Figure 2A:
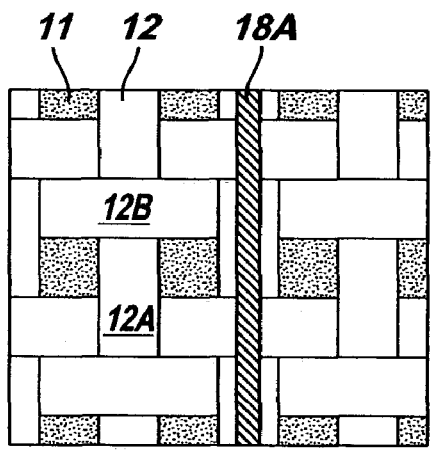
FIGS. 2A and 2B are diagrams of printed circuit boards in which a trace is disposed upon a glass fiber and between glass fibers, respectively, according to the prior art.
Figure 2B:
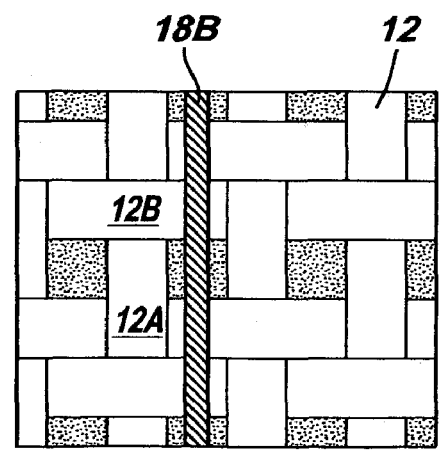

An enlarged inset of the glass strands 12 provides a closer view of the weave pattern, which is typical for PCB laminates such as FR-4. As illustrated by the cross-hatch pattern, the glass strands 12 are disposed orthogonal to the sides of the PCB 10. As also depicted in FIGS. 2A and 2B, the glass strands 12 includes vertically disposed strands 12A and horizontally disposed strands 12B, interwoven so as to enhance the strength of the PCB laminate. The vertically disposed strands 12A are substantially parallel to the side 10A of the PCB while the horizontally disposed strands 12B are substantially parallel to the side 10B of the PCB.

FIGS. 2A and 2B provide a closer view of the PCB 10, also according to the prior art. The PCB 10 is embedded with vertically and horizontally disposed strands 12, just as in FIG. 1. In FIG. 2A, a trace 18A is positioned over a vertically disposed strand 12A. In FIG. 2B, a trace 18B is positioned between two vertically disposed strands 12A.

When an individual circuit trace lines up along a strand, such as with trace 18A of FIG. 2A, the trace achieves a relatively higher $D_k$ compared to the trace 18B, which is between two strands. The variation in $D_k$ between the traces 18A and 18B results in differences in signal propagation speeds, causing timing problems that are difficult to predict. Particularly when the traces 18A and 18B are differential mode signals, or are two of several bus signals, the different propagation speeds can cause an undesirable mode conversion problem. Additionally, the traces 18A and 18B may have different impedances resulting from the variation in $D_k$.

Practically speaking, the trace 18A might not be disposed over the strand 12A for the entire length of the trace. The weave pattern of the glass strands 12 may be skewed somewhat from being parallel to the sides of the PCB along its entire length or width. Likewise, the trace 18B may, at some point along the trace, be disposed directly over the glass strands 12, causing its $D_k$ to be somewhat higher at that point. This uncertainty limits the ability to successfully predict the speed of signals propagating over the traces.

Returning to FIG. 1, the trace 18 disposed between the circuits 30 and 32 has a physical length, $L_0$. Its "electrical length" is defined as the physical length of the trace 18 multiplied by its dielectric constant, $D_k$. The electrical length term reflects the effect that the $D_k$ of the trace has on the speeds of signals traveling along the trace 18. Traces disposed directly over a glass strand (e.g., trace 18A of FIG. 2A) will generally have a longer electrical length than traces disposed between glass strands (e.g., trace 18B of FIG. 2B), such that signals traversing the trace 18A take longer to arrive at their destination than signals traversing the trace 18B.

Because the relationship between trace placement and the location of the glass strands or other reinforcement material is random, the $D_k$ for the trace 18 can only approximately be known. The dielectric constant, $D_k$, can thus be thought of as having two components, a known component ($k_1$) and an unknown component ($k_2$), where $D_k = k_1 + k_2$. So, in ascertaining the electrical length of the trace 18, some tolerance exists, namely, $\pm k_2 \times L_0$.

Suppose that the trace 18, instead of being disposed over or next to a glass strand, is orthogonal to the glass strands. (The traces 18A and 18B are, in fact, orthogonal to several of the horizontally disposed strands 12B.) If the trace 18 crosses over a single strand or fifty strands, the trace will have the same average $D_k$. In other words, the known component, $k_1$, of $D_k$, is obtainable where the trace is disposed over any integer number of strands. Practically, though, the trace could be disposed over a fraction of a glass strand, say, a half or a third of a strand, at its end. The $D_k$ for this residual portion is uncertain (the unknown component, $k_2$) and, thus, makes the electrical length of the entire trace 18 uncertain.

One way to reduce the effect of the unknown component, $k_2$, is to increase the incidence of the known component, $k_1$. If, for example, the trace 18 is disposed orthogonal to 100.5 glass strands 12, the length of the trace that is subject to uncertainty (the portion that is disposed over half a strand) has been reduced by a factor of 100, as compared to a trace disposed over just a half of a strand. By increasing the number of integer strands traversed, the effect of the unknown component, $k_2$, is diminished by a factor equal to the integer value, known herein as the reduction factor. Thus, the trace 18 is preferably routed on the PCB 10 so as to cross over as many glass strands as possible, so as to increase the reduction factor.

As FIGS. 2A and 2B illustrate, while the trace may be disposed orthogonal to a number of glass strands, it also may be placed directly over a glass strand, between two glass strands, or partially over one or more glass strands. Currently, traces are generally disposed in the same direction as either the vertically disposed glass bundles 12A or the horizontally disposed glass bundles 12B. The trace routing technique of the prior art thus inhibits the ability to minimize the effect of the unknown component, $k_2$, in establishing the $D_k$ of the trace.

Figure 3:
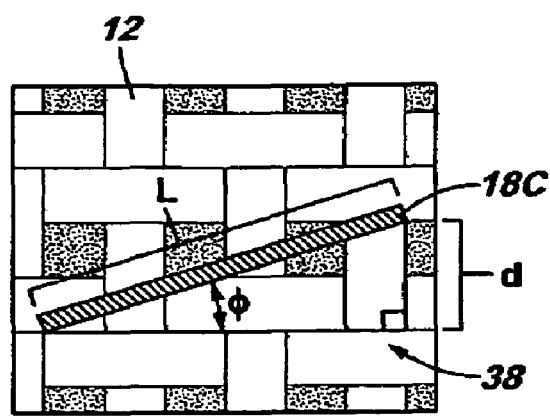
FIG. 3 is a diagram of a printed circuit board in which a trace is disposed in a non-orthogonal manner, according to some embodiments.

As an alternative, in FIG. 3, according to some embodiments, a trace 18C is disposed in a manner so as to cross a number of glass strands, both vertically disposed strands 12A and horizontally disposed strands 12B. The trace 18C is disposed at an angle, $\phi$, relative to one of the horizontal glass strands 12B. A right triangle 38 is formed with the side opposite the angle, $\phi$, having a length d, where d is the distance between the center of two horizontal glass strands, and a hypotenuse of length L. The distance, d, is a constant, based on the density of the glass strands 12, known herein as the strand separation.

The trace 18C is neither orthogonal to the vertical strands 12A nor to the horizontal strands 12B. Instead, the trace is disposed over a number of strands and, being disposed at the angle, $\phi$, relative to one of the strands, there is little likelihood that the trace 18C will be disposed above a single glass strand, such as in FIG. 2A, as long as the angle, $\phi$, is not 0° or a multiple of 90°. The right triangle 38 indicates how many glass strands are traversed by a trace of length L, disposed at the angle, $\phi$, where the distance between glass strands, or strand separation, is d.

Using basic trigonometry, the length, L, of the trace 18C can be determined for a given angle, $\phi$, and distance between strands, or strand separation, d. Likewise, for a given length, L, the angle, $\phi$ can be obtained. In FIG. 3, the trace 18C traverses a predetermined number, p, of strands. The more glass strands traversed by the trace, the lower the uncertainty in the $D_k$ of the trace. The predetermined number, p, thus provides the reduction factor of the trace 18C of length, L.

Once the number of glass strands traversed by the trace 18C of length, L, at angle, $\phi$, is known, the principles can be scaled for a trace whose length is multiples of L. So, where the predetermined number, p, is one-fifth the reduction factor, a trace of length 5L can be disposed on the PCB, at the same angle, $\phi$, relative to one of the glass strands, and will cross over five times as many strands as the trace 18C. The unknown component, $k_2$, of the dielectric constant, $D_k$, of the trace is reduced by a factor equal to the number of strands traversed.

Figure 4:
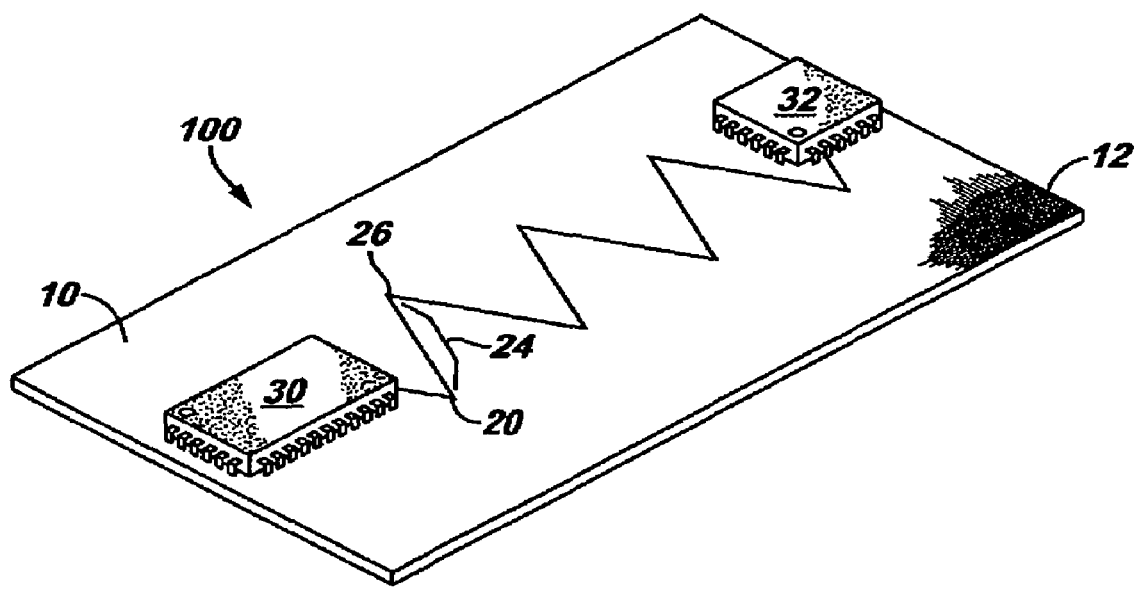
FIG. 4 is a diagram of a system including traces routed using a trace routing method, according to some embodiments.

Using this information, a trace between two circuits can be routed so as to preferably reduce the impact of the unknown component, $k_2$, of the dielectric constant, $D_k$ of the trace. In FIG. 4, according to some embodiments, a PCB 100 is depicted, including a zig-zag trace 20 for single-ended mode transmission of a signal between circuits 30 and 32. The shape and size of the zig-zag trace 20 is mathematically determined with reference to the position of the glass strands 12 within the PCB 100.

The zig-zag trace 20 includes multiple mini-traces 24 which are routed at a glass strands 12″ with predetermined angle relative to the glass strands 12 (see angle $\phi$ in FIG. 3). Two mini-traces 24 meet at an endpoint 26. The angle $\phi$ and length of the mini-traces 24 are determined, using a trace routing method 300, described in FIG. 5, below, so as to reduce the uncertainty of $D_k$ by a desired reduction factor. The traces 20 are then routed in a zig-zag pattern between the circuits 30 and 32, incorporating the calculated angle $\phi$ and mini-trace 24 length.

The use of a zig-zag trace over a straight-line trace involves a tradeoff between having the shortest traces between circuits (there is a practical limit to how long the traces can be before excessive loss occurs) and having traces in which the signal propagation speed can be successfully predicted. In some embodiments, using the trace routing method 300, the improvements timing accuracy are greater than an order of magnitude while the added loss at high frequencies (due to the longer trace length) is less than ten percent.

The trace routing method 300 ensures that each mini-trace 24 passes over a predetermined number of strands in the reinforcement material 12, wherein the predetermined number is equal to the desired reduction factor. In passing over any integer number of strands, the average deviation of the dielectric constant, $D_k$, is a constant. Only the last portion of the mini-trace 24, which passes over a fraction of a strand, results in a deviation of the $D_k$ for that mini-trace. The errors can be thought to accumulate at the endpoints 26 of the zig-zag trace 20. The deviation for each mini-trace 24 can be accumulated over the number of mini-traces 24 in the trace 20, to yield a total deviation or error. The error can be adjusted by changing the angle $\phi$ and/or the length of the mini-trace 24, resulting in a change of relative position between the zig-zag trace 20 and the weave pattern of the reinforcement material 12.

In FIG. 4, each mini-trace 24 of the trace 20 has the same length and angle $\phi$. However, the trace 20 can be formed of mini-traces of varying length and disposition, relative to the underlying glass strands. For example, one mini-trace might have twice the length of another, and, thus, may be disposed at a more acute angle, relative to the glass strands. Various arrangements for the trace 20, other than that depicted in FIG. 4, are possible.

The routing methods commonly used on printed circuit boards in the computer industry essentially ignore the weave characteristics of the PCB laminate. (One exception is in the microwave industry, in which PCBs may be routed with traces disposed at 45° angles relative to the underlying reinforcement material.) The result is that measured signal velocities, impedances, and signal skews differ substantially from those of circuit simulations. The trace routing method 300 reduces the errors in timing, skew, and/or common-mode generation, by more than an order of magnitude, in some embodiments, such that much greater timing accuracies on the PCBs can be obtained.

In the flow diagram of FIG. 5, the trace routing method 300 is described, for optimizing the route path of a trace on a heterogeneous PCB. The trace 20 of FIG. 4, for single-ended mode transmission, is used to illustrate the method 300, although the principles described herein can equally be applied to differential signal traces, bus signal traces, and any other traces that are routed on a heterogeneous PCB.

The trace routing method 300 uses a formula to mathematically relate the worst-case accumulation of periodic variations in dielectric properties (caused by the heterogeneous composition of the PCB material) to an angle made between the trace 20 and the strands of the reinforcement material 12 within the PCB 100. In some embodiments, the method 300 is implemented using commercially available software for executing mathematical functions.

In some embodiments, the function, r, is used in the trace routing method. Function r provides the residual length of a trace, that is, the part of the trace that does not cross over an integer number of strands. The function, r, has three arguments, L, d, and $\phi$, and is given below:

$$r(L, d, \phi) := d/(\sin(\phi)) \times \text{fract}(L \times (\sin(\phi)/d)) \quad (1)$$

where L is the length of a trace portion, d is the distance between the glass strands within the PCB, and $\phi$ is the angle between the trace portion and the strands. The trace 18C of FIG. 3, which has these characteristics, may be referred to in understanding the function. Additionally, fract(n) is a function used to convert a number into its fractional part.

The function, r(L, d, $\phi$), has two parts, a first quantity and the fractional part of a second quantity. The first quantity provides the length of the trace portion, L, which covers the distance from the center of one glass strand to the center of an adjacent glass strand, at the angle, $\phi$. The second quantity is the fractional part of the total length of the trace, L, divided by the first quantity. The second quantity indicates how many sections of length, L, can be fit into a trace. The function takes the fractional result and multiplies it by the length of the hypotenuse. The result, r, the residual trace length, is how much length of the trace remains after one or more trace portions fits into the total trace length. The equation (1) thus determines how much length of the trace remains when the rest of the trace traverses an integer number of glass strands.

In FIG. 5, the trace routing method 300 is used to obtain the residual trace length for the trace 20 of FIG. 4. The trace routing method 300 commences by specifying various design parameters for the execution of the residual trace length function (block 302). Some design parameters are based on the physical characteristics of the PCB laminate. In particular, the distance, d, between the glass strands 12 is obtained. Values are assigned to these parameters, such as by performing measurements. In some embodiments, the values assigned are reasonable approximations.

Also, the reduction factor, i.e., the factor by which the uncertainty ($k_2$) in the $D_k$ is to be reduced is determined (block 304). In other words, the minimum number of integer strands to be traversed by each mini-trace 24 is selected. For a reduction factor of fifty, the trace portion traverses fifty glass strands.

The flow diagram of FIG. 5 shows two paths for obtaining the residual trace length. As one option, the length of a mini-trace 24, L, is selected (block 306). Using trigonometry, the angle, $\phi$, between the mini-trace and a glass strand, which yields the desired number of strand crossings is calculated (block 308). As an alternative, the routing angle, $\phi$, can be selected (block 310), such that the length, L, of the mini-trace that yields the desired number of strand crossings is calculated (block 312). Since the optimal trace angle and mini-trace length for the PCB are not yet known, several selections of the angle, $\phi$, and the length, L, may be evaluated.

Once the routing angle and mini-trace length are known, the residual trace length, r, is obtained (block 314), in some embodiments, by executing the function (1), above. The residual trace length is then multiplied by the number of mini-traces 24 that are in the zig-zag trace 20 (block 316), the number being selected so that the product is approximately an integer.

The trace routing method 300 thus enables a system designer to design a trace 20 with an angle, $\phi$, and length, L, such that each mini-trace 24 crosses an integer number of traces, as nearly as possible, for the given characteristics of the glass strands 12. The trace routing method 300 may be repeated, as many times as desired, by using a different trace angle, $\phi$, or by using a different mini-trace length, L, until an optimum trace angle and mini-trace length are obtained. Various embodiments of the trace routing method 300 may also utilize fewer or more steps, and this method may be performed using a number of different implementations, depending on the application.

Figure 6A:
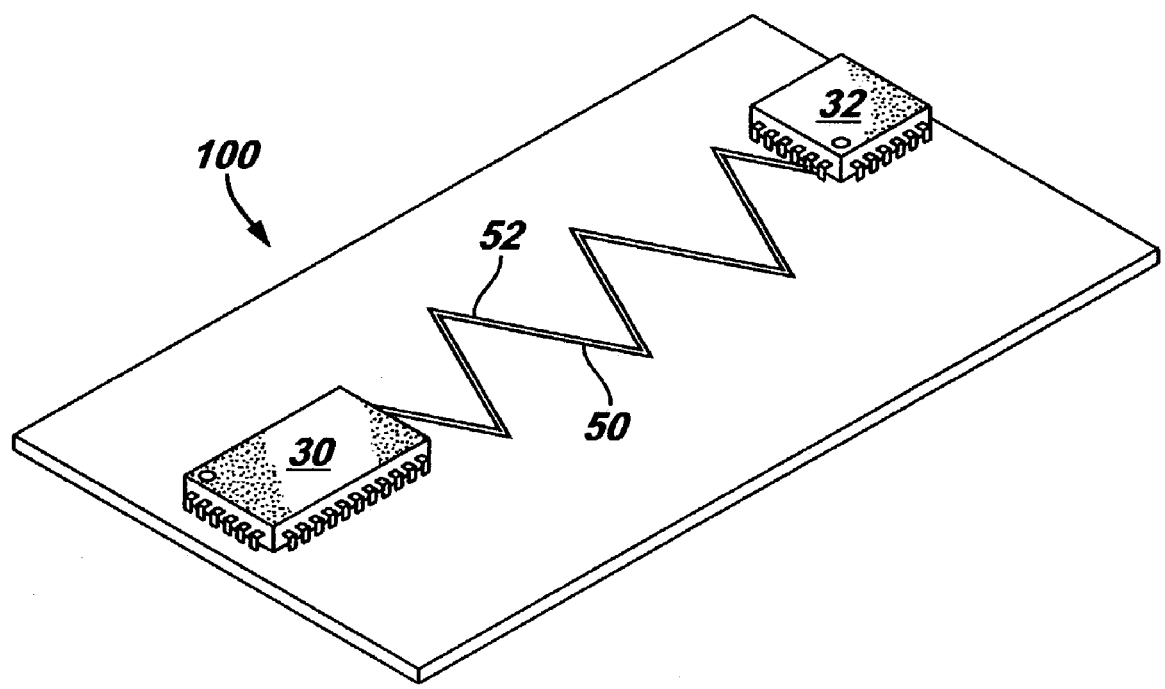
FIGS. 6A and 6B are diagrams of printed circuit boards in which zig-zag traces for differential and bus signals, respectively, are routed, according to some embodiments.
Figure 6B:
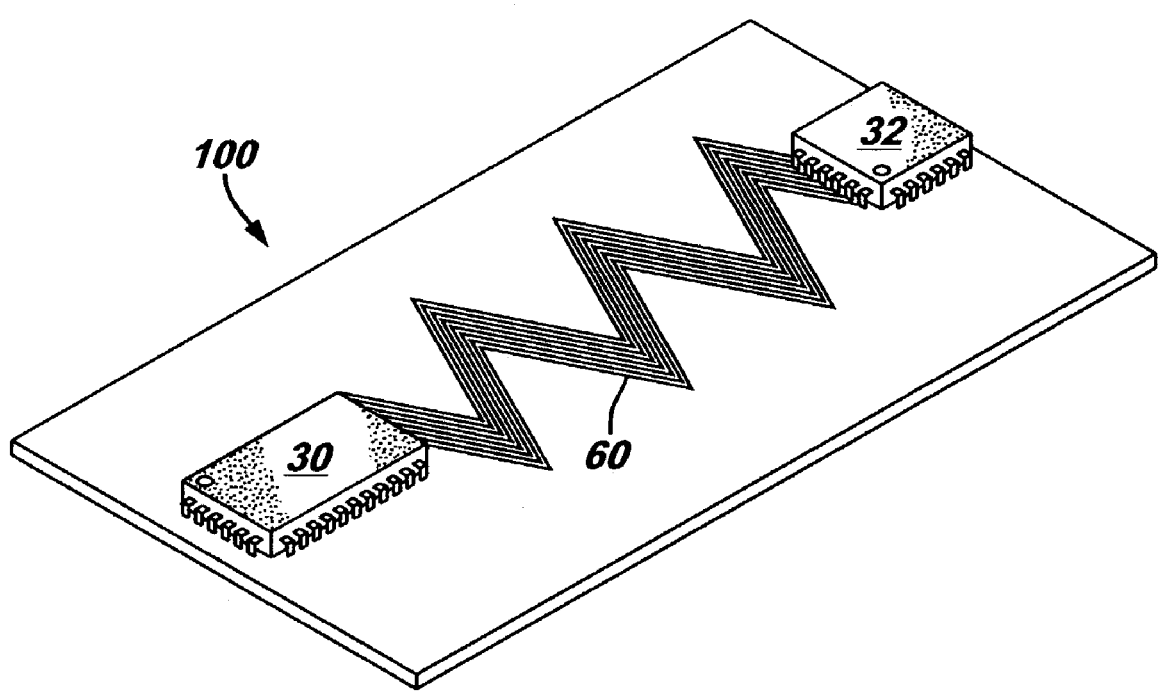

In FIG. 6A, the circuits 30 and 32 are interconnected by a pair of zig-zag traces 50 and 52, for differential mode transmission of signals. In FIG. 6B, the circuits are connected by a plurality of zig-zag traces 60, for transmitting bus signals. Like the trace 20 for single-ended mode transmission, the differential and bus signal traces are disposed on the PCB 100 using the trace routing method 300. The trace routing method 300 ensures the optimum placement of traces in relation to the location of the glass strands within the PCB, such that the dielectric constants for each of the differential and bus traces are substantially similar.

In a differential signaling environment, the signal travels along multiple signaling paths. Differential pair traces are typically routed as close to one another as possible, are the same length, and are equidistant at all points along the traces. These properties can be achieved with zig-zag traces. The receiver (such as the circuit 30) is generally sensitive to the differential mode and less sensitive to the common mode. This is because noise interfering with the signal tends to impact both (or all) signal traces equally, in other words, in the common mode. Physical mechanisms, such as varying impedances and signal speeds along the multiple traces, can cause "common mode conversion" to occur, such that common mode signals unintentionally become differential mode signals, and vice-versa.

By averaging the $D_k$ for each trace, signal propagation speeds and impedances can be controlled. Phenomena, such as common mode conversion, can likewise be minimized using the trace routing method 300. The method 300 can thus be used for single-ended mode, differential mode, and bus mode transmission of signals.

The trace routing method 300 determines an optimal routing path for a trace over a heterogeneous PCB. The zig-zag pattern of the trace 20 ensures that each mini-trace passes over several strands of the underlying weave pattern, such that the unknown component of the $D_k$ is minimized. However, the benefits of the trace routing method 300 can be achieved without zig-zag traces.

Figure 7:
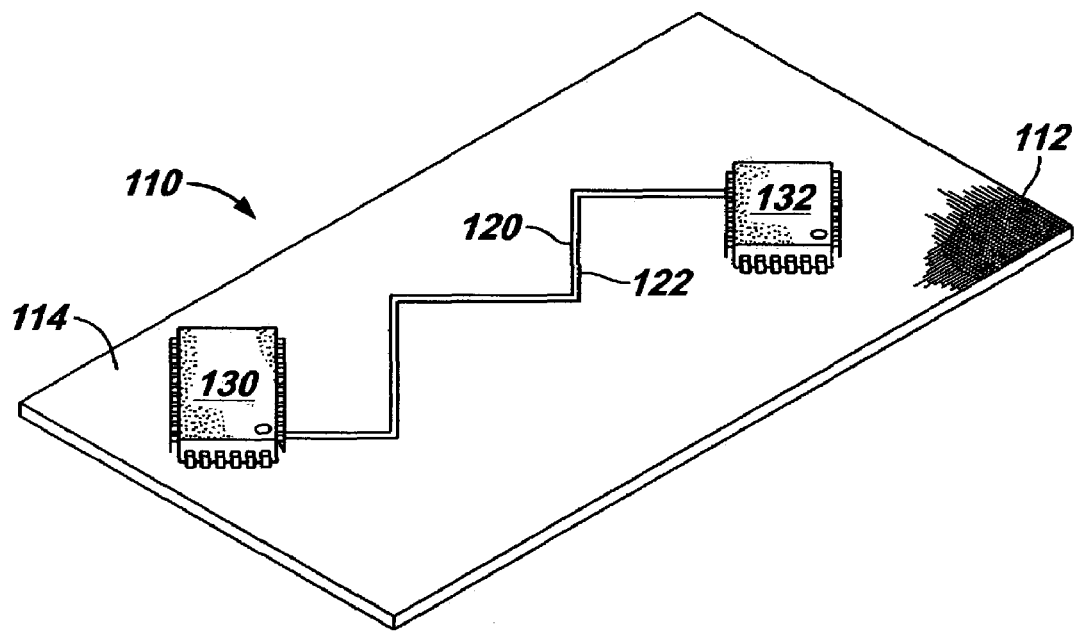
FIG. 7 is a diagram of a printed circuit board in which circuits are disposed in a non-orthogonal manner, according to some embodiments.

For example, in FIG. 7, a heterogeneous printed circuit board 110 is depicted, which includes a reinforcement material 112, such as woven fiberglass strands, embedded within a resin-based material 114, and an overlying conductive material that forms traces 120 and 122. Two circuits 130 and 132, are disposed upon the PCB 110. The circuits 130 and 132 are square or rectangular in shape. These circuits are laid upon the PCB 110 in a non-typical manner. Instead of being laid out orthogonal to the sides of the boards, the circuits 130 and 132 are disposed such that the sides of the circuits are not parallel to the sides of the PCB 110. However, the traces 120 and 122 are orthogonal to the circuits 130 and 132. In other words, the traces are routed in a direction parallel or perpendicular to the sides of the circuits 130 an 132 (rather than to the sides of the PCB 110), taking right-angle turns, where needed, in providing an electrical connection path between the circuits.

The PCB 110 is a typical printed circuit board, with the reinforcement material 112 typically being aligned at right angles within the PCB material in a weave pattern. (A cutout of the PCB 110 illustrates the orientation of the reinforcement material 112.) The weave pattern is substantially orthogonal to two sides of the PCB and parallel to two sides, although some deviation from this alignment may occur. By positioning the circuits and routing the traces as shown in FIG. 7, the trace portions are likely to pass over several strands of the reinforcement material, such that the unknown component, $k_2$, of the $D_k$ is minimized. Further, the $D_k$ for the two parallel traces 120 and 122 are substantially similar, so as to mitigate common mode conversion, impedance mismatches, and other undesirable phenomena.

Figure 8:
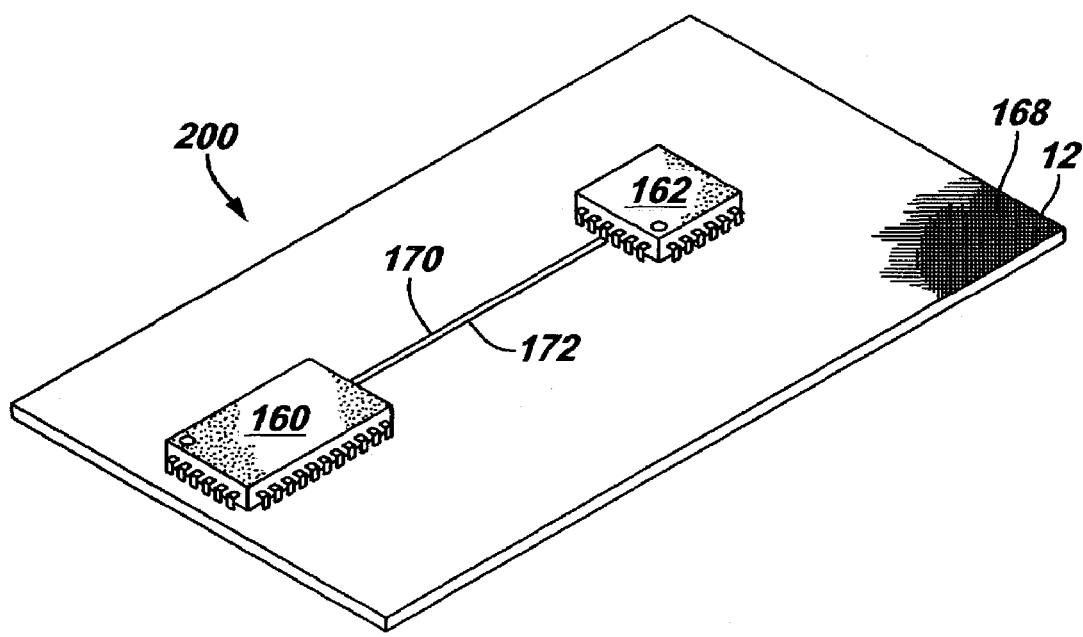
FIG. 8 is a diagram of a printed circuit board in which the reinforcement material is disposed in a non-orthogonal manner, according to some embodiments.

As another possibility, FIG. 8 depicts a printed circuit board 200 in which circuits 160 and 162 are disposed in a typical manner, that is, orthogonal to the sides of the PCB. A cutout of the PCB 200 shows that the orientation of the embedded reinforcement material 168 is not orthogonal to the sides of the PCB, as is typically the case. The repositioning of the reinforcement material 168 may be achieved during production of the PCB or by cutting the PCB in an atypical manner.

Traces 170 and 172 are routed on the PCB 200 as straight-line or right-angle traces. Since the underlying reinforcement material 168 is not orthogonal to the sides of the PCB 200, the traces 170 and 172 are likely to cross over several strands of the reinforcement material, minimizing the effect of the unknown component of the dielectric constant. Further, the $D_k$ for the traces 170 and 172 are substantially similar.

While the invention has been described with respect to a limited number of embodiments, those skilled in the art will appreciate numerous modifications and variations therefrom. It is intended that the appended claims cover all such modifications and variations as fall within the true spirit and scope of the invention.

We claim:

1. A system, comprising:
    a printed circuit board comprising a reinforcement material embedded within a resin-based material, wherein the reinforcement material comprises strands arranged in a weave pattern, the strands of the weave pattern having a predetermined distance between any two strands; and
    a trace disposed on the printed circuit board, the trace for supplying a signal path between circuits residing on the printed circuit board, the trace comprising a number of mini-traces coupled so as to form a zigzag pattern, wherein one mini-trace of the number of mini-traces is disposed at an angle relative to one of the strands, the angle being selected so that the one mini trace crosses over a desired number of strands, the one mini-trace further having a calculated length defining a residual trace length for the one mini-trace length and selecting the number of mini-traces so that the residual trace length multiplied by the number is approximately an integer value, wherein
    the calculated length, the residual length, and the angle satisfy the following relationship:

$r(L, d, \phi) := d/(\sin(\phi)) \times \text{fract}(L \times (\sin(\phi)/d))$, where L is the calculated length, d is the predetermined distance, $\phi$ is the angle and r is the residual length.

2. The system of claim 1, further comprising:
    a second trace for supplying a signal path between circuits residing on the printed circuit board, the second trace being routed to be substantially equidistant from the trace at all points along the traces, wherein the trace has a first dielectric constant and the second trace has a second dielectric constant, wherein the first dielectric constant is substantially similar to the second dielectric constant.

3. The system of claim 2, further comprising:
    a third trace disposed on the printed circuit board so as to be substantially parallel to the second trace, the third trace being routed to be substantially equidistant from the second trace at all points along the traces, the third trace having a third dielectric constant, wherein the second dielectric constant is substantially similar to the third dielectric constant.

4. The system of claim 1 the number of mini traces further comprising: a second mini-trace having a second length and a second angle, wherein the length is not identical to the calculated length and the angle is not identical to the second angle.

5. The system of claim 4, wherein each of the pair of traces traverses at least a predetermined number of strands of the reinforcement material, wherein the predetermined number is a factor by which an unknown component of the dielectric constant of each trace is reduced.

6. The system of claim 5, wherein each of the pair of traces traverses a residual portion of a strand of the reinforcement material, wherein the dielectric constant of the residual portion is equal to the unknown component.

7. A system, comprising: a printed circuit board comprising a reinforcement material embedded within a resin-based material, wherein the reinforcement material comprises strands arranged in a weave pattern, the strands of the weave pattern having a predetermined distance between any two strands; and a trace disposed on the printed circuit board, the trace for supplying a signal path between circuits residing on the printed circuit board, the trace comprising a number of mini-traces coupled so as to form a zigzag pattern, one mini-trace of the number of mini-traces having a length, the length being selected so that the one mini trace crosses over a desired number of strands, wherein the number of mini-traces is obtained by calculating a residual trace length for one mini-trace length and selecting the number of mini-traces so that the residual trace length multiplied by the number is approximately an integer value,
    the one mini-trace further having a calculated angle relative to one of the strands of the printed circuit board, wherein calculated angle is based on the length, the predetermined distance between the strands in the printed circuit board, and the desired number of strands, wherein
    the calculated length, the residual length, and the angle satisfy the following relationship:

$r(L, d, \phi) = d/(\sin \phi)) \times \text{fract}(L \times (\sin(\phi)/d))$, where, L is the calculated length, d is the predetermined distance, $\phi$ is the angle, and r is the residual length.

8. The system of claim 7, further comprising:
    a second trace for supplying a signal path between circuits residing on the printed circuit board, the second trace being routed to be substantially equidistant from the trace at all points along the traces, wherein the trace has a first dielectric constant and the second trace has a second dielectric constant, wherein the first dielectric constant is substantially similar to the second dielectric constant.

9. The system of claim 8, further comprising:
a third trace disposed on the printed circuit board so as to be substantially parallel to the second trace, the third trace being routed to be substantially equidistant from the second trace at all points along the traces, the third trace having a third dielectric constant, wherein the second dielectric constant is substantially similar to the third dielectric constant.

10. The system of claim 7, the number of mini-traces further comprising: a second mini-trace having a second length and a second angle, wherein the length is not identical to the second length and the calculated angle is not identical to the second angle.

11. A method, comprising:
identifying a distance between two strands of reinforcement material within a printed circuit board;
specifying an angle between a trace and one of the two strands;
calculating a length of the trace when the trace is disposed at the specified angle over strands with the identified distance there between, such that a desired integer number of strands is traversed by the trace at the specified angle and the calculated length;
routing the trace on the printed circuit board at the specified angle in relation to one of the two strands and at the calculated length;
obtaining a residual trace length for the trace; and routing a number of traces on the printed circuit board in a zigzag pattern, wherein the residual trace length times the number of traces is approximately an integer value, wherein,
the calculated length, and residual length and the angle satisfy the following relationship:

$$r(L, d, \phi) = d/(\sin \phi)) \times \text{fract}(L \times (\sin(\phi)/d)),$$

where L is the calculated length, d is the predetermined distance, $\phi$ is the angle, and r is the residual length.

12. The method of claim 11, further comprising:
obtaining a residual length of the trace that does not traverse the integer number of strands; and
multiplying the residual length by the number, wherein the residual length of the trace has a dielectric constant that is the unknown component.

13. A method, comprising:
identifying a distance between two strands of reinforcement material within a printed circuit board;
specifying a length of a trace;
calculating a angle between the trace and one of the two strands for the specified trace length over strands with the identified distance there between, such that a desired integer number of strands is traversed by the length of the trace at calculated angle;
routing the trace on the printed circuit board at the calculated angle in relation to one of the two strands and at the specified length;
obtaining a residual trace length for the trace; and routing a number of traces on the printed circuit board in a zigzag pattern, wherein the residual trace length times the number of traces is approximately an integer value, wherein,
the calculated length, residual length and the angle satisfy the following relationship:

$$r(L, d, \phi) = d/(\sin \phi)) \times \text{fract}(L \times (\sin(\phi)/d)),$$

where L is the calculated length, d is the predetermined distance, $\phi$ is the angle, and r is the residual length.

14. The method of claim 13, further comprising:
obtaining a residual length of the trace that does not traverse the integer number of strands
multiplying the residual length by the integer number, wherein the residual length of the trace has a dielectric constant that is the unknown component.

* * * * *